(12) United States Patent
Besser et al.

(10) Patent No.: US 8,778,789 B2
(45) Date of Patent: Jul. 15, 2014

(54) METHODS FOR FABRICATING INTEGRATED CIRCUITS HAVING LOW RESISTANCE METAL GATE STRUCTURES

(71) Applicant: GLOBALFOUNDRIES Inc., Grand Cayman (KY)

(72) Inventors: Paul R. Besser, Sunnyvale, CA (US); Sean X. Lin, Watervliet, NY (US); Valli Arunachalam, Pleasant Valley, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 46 days.

(21) Appl. No.: 13/689,844

(22) Filed: Nov. 30, 2012

(65) Prior Publication Data

US 2014/0154877 A1     Jun. 5, 2014

(51) Int. Cl.
*H01L 21/3205* (2006.01)

(52) U.S. Cl.
USPC ........... 438/586; 438/186; 257/296; 257/597; 257/E21.62; 257/E21.641

(58) Field of Classification Search
USPC .................... 257/296, 597, E21.62, E21.641; 438/168, 586
See application file for complete search history.

(56) References Cited

U.S. PATENT DOCUMENTS

| | | | | |
|---|---|---|---|---|
| 6,159,782 A * | 12/2000 | Xiang et al. | | 438/197 |
| 6,229,186 B1 * | 5/2001 | Ishida | | 257/390 |
| 6,274,409 B1 * | 8/2001 | Choi | | 438/128 |
| 6,504,210 B1 * | 1/2003 | Divakaruni et al. | | 257/344 |
| 7,180,192 B2 * | 2/2007 | Hasunuma et al. | | 257/758 |
| 7,405,112 B2 * | 7/2008 | Besser | | 438/154 |
| 7,902,581 B2 * | 3/2011 | Frohberg et al. | | 257/296 |
| 8,084,354 B2 * | 12/2011 | Kahlert et al. | | 438/622 |
| 8,304,834 B2 * | 11/2012 | Yelehanka et al. | | 257/351 |
| 2001/0049183 A1 * | 12/2001 | Henson et al. | | 438/479 |
| 2005/0082584 A1 * | 4/2005 | Hussein et al. | | 257/295 |
| 2005/0230716 A1 * | 10/2005 | Moriya et al. | | 257/288 |
| 2005/0275005 A1 * | 12/2005 | Choi et al. | | 257/300 |
| 2005/0277258 A1 * | 12/2005 | Huang et al. | | 438/300 |
| 2006/0017098 A1 * | 1/2006 | Doczy et al. | | 257/330 |
| 2008/0076216 A1 * | 3/2008 | Pae et al. | | 438/257 |
| 2008/0251855 A1 * | 10/2008 | Besser | | 257/377 |
| 2009/0087974 A1 * | 4/2009 | Waite et al. | | 438/592 |
| 2009/0146247 A1 * | 6/2009 | Erturk et al. | | 257/508 |
| 2010/0148274 A1 * | 6/2010 | Tai et al. | | 257/369 |
| 2011/0156107 A1 * | 6/2011 | Bohr et al. | | 257/288 |
| 2011/0204518 A1 * | 8/2011 | Arunachalam | | 257/751 |
| 2011/0291292 A1 * | 12/2011 | Frohberg et al. | | 257/774 |
| 2011/0298061 A1 * | 12/2011 | Siddiqui et al. | | 257/410 |

(Continued)

*Primary Examiner* — Andres Munoz
*Assistant Examiner* — Caleb Henry
(74) *Attorney, Agent, or Firm* — Ingrassia Fisher & Lorenz, P.C.

(57) ABSTRACT

Methods for fabricating integrated circuits having low resistance metal gate structures are provided. One method includes forming a metal gate stack in a FET trench formed in a FET region. The metal gate stack is etched to form a recessed metal gate stack and a recess. The recess is defined by sidewalls in the FET region and is disposed above the recessed metal gate stack. A liner is formed overlying the sidewalls and the recessed metal gate stack and defines an inner cavity in the recess. A copper layer is formed overlying the liner and at least partially fills the inner cavity. The copper layer is etched to expose an upper portion of the liner while leaving a copper portion disposed in a bottom portion of the inner cavity. Copper is electrolessly deposited on the copper portion to fill a remaining portion of the inner cavity.

20 Claims, 11 Drawing Sheets

(56) References Cited

U.S. PATENT DOCUMENTS

| | | | |
|---|---|---|---|
| 2012/0104469 A1* | 5/2012 | Li et al. | 257/288 |
| 2012/0299072 A1* | 11/2012 | Kim et al. | 257/296 |
| 2013/0137257 A1* | 5/2013 | Wei et al. | 438/586 |
| 2013/0288468 A1* | 10/2013 | Chi, Min-Hwa | 438/525 |
| 2013/0288471 A1* | 10/2013 | Chi, Min-Hwa | 438/586 |
| 2014/0042561 A1* | 2/2014 | Guo et al. | 257/411 |

* cited by examiner

METHODS FOR FABRICATING INTEGRATED CIRCUITS HAVING LOW RESISTANCE METAL GATE STRUCTURES

TECHNICAL FIELD

The present invention relates generally to integrated circuits, and more particularly relates to methods for fabricating integrated circuits having low resistance metal gate structures.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the device size decreases.

In some integrated circuit designs there has been a desire to eliminate the use of polysilicon gate electrodes to improve device performance with decreased feature sizes. Replacing polysilicon gate structures with metal gate structures is one solution. Often, metal gate structures are formed in trenches in FET device regions and utilize aluminum or tungsten as a metal fill portion in the trenches in conjunction with a work function metal layer(s). The aluminum or tungsten metal fill portion is used as a conductive metal fill to offset the relatively higher resistance of the work function metal layer(s) to lower the overall resistance of the metal gate structure. However, as device sizes get smaller, metal gate structures with lower resistance than conventional metal gate structures formed with aluminum or tungsten metal fills are needed. Copper exhibits lower resistance than aluminum and tungsten. Unfortunately, copper typically forms conductive metal fill with voids when deposited in relatively small trenches. The presence of voids within the copper fill can increase the resistance of the metal gate structure and adversely affect the electrical characteristics of the resulting device.

Accordingly, it is desirable to provide methods for fabricating integrated circuits having low resistance metal gate structures. Furthermore, other desirable features and characteristics of the present invention will become apparent from the subsequent detailed description and the appended claims, taken in conjunction with the accompanying drawings and the foregoing technical field and background.

BRIEF SUMMARY

Methods for fabricating integrated circuits having low resistance metal gate structures are provided herein. In accordance with an exemplary embodiment, a method for fabricating an integrated circuit includes forming a metal gate stack in a FET trench formed in a FET region. The FET region includes an interlayer dielectric material on a semiconductor substrate. The metal gate stack is etched to form a recessed metal gate stack and a recess. The recess is defined by sidewalls in the FET region and is disposed along an upper section of the FET trench above the recessed metal gate stack. A liner is formed overlying the sidewalls and the recessed metal gate stack and defines an inner cavity in the recess. A copper layer is formed overlying the liner and at least partially fills the inner cavity. The copper layer is etched to expose an upper portion of the liner while leaving a copper portion disposed in a bottom portion of the inner cavity. Copper is electrolessly deposited on the copper portion to fill a remaining portion of the inner cavity.

In accordance with another exemplary embodiment, a method for fabricating an integrated circuit is provided. The method includes forming a metal gate stack in a FET trench formed in a FET region. The FET region includes an interlayer dielectric material on a semiconductor substrate. The metal gate stack is etched to form a recessed metal gate stack and a recess. The recess is defined by sidewalls in the FET region and is disposed along an upper section of the FET trench above the recessed metal gate stack. A liner is formed overlying the sidewalls and the recessed metal gate stack and defines an inner cavity in the recess. A copper seed layer is deposited overlying the liner. The copper seed layer is reflowed to form a reflowed copper seed layer that partially fills the inner cavity. The reflowed copper seed layer is etched to expose an upper portion of the liner while leaving a copper portion disposed in a bottom portion of the inner cavity. Copper is electrolessly deposited on the copper portion to fill a remaining portion of the inner cavity.

In accordance with another exemplary embodiment, a method for fabricating an integrated circuit is provided. The method includes forming a metal gate stack in a FET trench formed in a FET region. The FET region includes an interlayer dielectric material on a semiconductor substrate. The metal gate stack is etched to form a recessed metal gate stack and a recess. The recess is defined by sidewalls in the FET region and is disposed along an upper section of the FET trench above the recessed metal gate stack. A liner is formed overlying the sidewalls and the recessed metal gate stack and defines an inner cavity in the recess. The inner cavity is filled with copper to define a copper fill. The copper fill is etched to expose an upper portion of the liner while leaving a copper portion disposed in a bottom portion of the inner cavity. Copper is electrolessly deposited on the copper portion to fill a remaining portion of the inner cavity.

BRIEF DESCRIPTION OF THE DRAWINGS

The present invention will hereinafter be described in conjunction with the following drawing figures, wherein like numerals denote like elements.

FIGS. 1-7E illustrate methods for fabricating integrated circuits having device contacts in accordance with various embodiments. FIGS. 1-7E illustrate the integrated circuit in cross sectional view during various stages of its fabrication.

DETAILED DESCRIPTION

The following Detailed Description is merely exemplary in nature and is not intended to limit the invention or the application and uses of the invention. Furthermore, there is no intention to be bound by any theory presented in the preceding background or the following detailed description.

Various embodiments contemplated herein relate to methods for fabricating integrated circuits having low resistance metal gate structures. During intermediate stages of the fabrication of an integrated circuit (IC), a metal gate stack is formed in a FET trench that is formed in a FET region. The FET region includes an interlayer dielectric material on a semiconductor substrate. The metal gate stack is etched to form a recessed metal gate stack and a recess. The recess is defined by sidewalls in the FET region and is disposed along an upper section of the FET trench above the recessed metal gate stack. A liner is formed overlying the sidewalls and the recessed metal gate stack and defines an inner cavity in the recess. In an exemplary embodiment, the liner includes at least a barrier layer that helps prevent migration of copper through the liner. A copper layer is formed overlying the liner and at least partially fills the inner cavity. The copper layer is etched to remove copper from an upper portion of the liner, thereby exposing the upper portion of the liner, while leaving some copper disposed in a bottom portion of the inner cavity. In an exemplary embodiment, the upper portion of the liner is substantially free of copper. Copper is then electrolessly deposited on the copper in the bottom portion to fill a remaining portion of the inner cavity with copper. Because the upper portion of the liner is substantially free of copper when copper is electrolessly deposited, copper grows substantially in one direction from the bottom portion to the top of the inner cavity to form a substantially void-free copper fill instead of growing copper in multiple competing directions, e.g., from both the bottom portion of the inner cavity and the upper portion of the liner, that might otherwise form trapped spaces or voids in the copper fill. As such, the substantially void-free copper fill is a substantially solid, highly conductive copper fill that cooperatively functions with the recessed metal gate stack as a relatively low resistance metal gate structure.

FIGS. 1-7E illustrate methods for fabricating an IC 10 including forming a metal gate structure 12 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the fabrication of ICs are well known and so, in the interest of brevity, many conventional steps will only be mentioned briefly herein or will be omitted entirely without providing the well-known process details.

Figure 1:
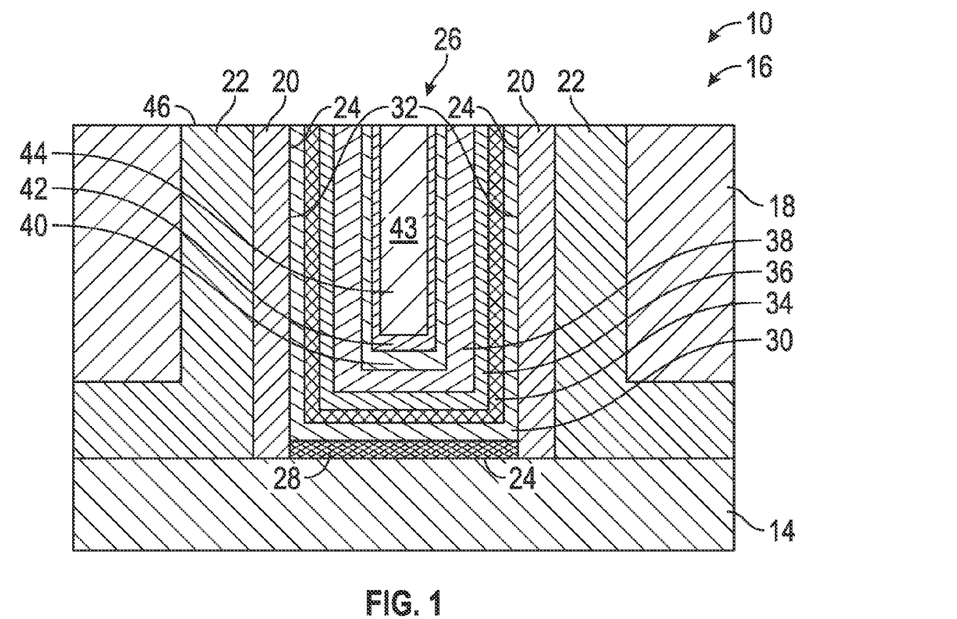

FIG. 1 illustrates, in cross sectional view, a portion of the IC 10 at an intermediate stage of fabrication in accordance with an exemplary embodiment. The IC 10 includes a semiconductor substrate 14 on which shallow trench isolation (STI) structures, source/drain regions, source/drain extension regions, gate dielectric, contacts, spacers, dummy gate patterns, hard masked layers, and other features may be formed. The semiconductor substrate 14 is typically a silicon wafer and includes various doping configurations as are known in the art to define a field effect transistor (FET) region 16, which may be a N-channel field effect transistor (NFET) region or a P-channel field effect transistor (PFET) region. The semiconductor substrate 14 may also include other elementary semiconductor materials such as germanium or SiGe alloy. Alternatively, the semiconductor substrate 14 may include a compound semiconductor such as, silicon carbide, gallium arsenide, indium arsenide, or indium phosphide. Further, the semiconductor substrate 14 may optionally include an epitaxial layer (epi layer), may be strained for performance enhancement, and/or may include a silicon-on-isolator (SOI) structure. As shown, an interlayer dielectric (ILD) material 18 is formed on the semiconductor substrate 14 by chemical vapor deposition (CVD), high-density plasma CVD, spin-on, sputtering, or any other method known to those skilled in the art. The ILD material 18 may include silicon oxide, silicon oxynitride, or a low dielectric constant material.

In an exemplary embodiment, spacers 20 and 22 are disposed in the ILD material 18 and cooperatively define a FET trench 24, which may be for a NFET device or a PFET device. Typically, the FET trench 24 may be formed by forming a dummy gate pattern on the semiconductor substrate 14, forming the spacers 20 and 22 on the dummy gate pattern, depositing and planarizing the ILD material 18, and removing the dummy gate pattern.

Formed in the FET trench 24 is a metal gate stack 26. The metal gate stack 26 may be for a NFET device or a PFET device, and includes various layers such as dielectric, work function metal(s), etch stop, capping, and wetting layers. The metal gate stack 26 shown in FIG. 1 is an example of one possible metal gate stack configuration; the invention is not limited to this example and other metal gate stack configurations known in the art are within the scope of this invention. As illustrated, the metal gate stack 26 includes an interface layer 28 formed over the semiconductor substrate 14. The interface layer 28 may be, for example, composed of oxide, such as silicon oxide or silicon oxy nitride. The interface layer 28 may be deposited using any deposition process, such as a CVD process, a thermal oxidation process, or a wet chemical oxidation process. In an exemplary embodiment, the interface layer 28 has a thickness of from about 0.1 to about 3 nm.

A dielectric layer 30 of a high dielectric constant (high-k) insulator material is deposited overlying the interface layer 28 and wall linings 32 of the FET trench 24 by an atomic layer deposition (ALD) process, a CVD process, or the like. In an exemplary embodiment, the dielectric layer 30 has a thickness of from about 0.1 to about 3 nm and the high-k insulator material includes hafnium oxide, hafnium silicate, zirconium oxide, or hafnium aluminum oxide.

As illustrated, a capping layer 34 of titanium nitride (TiN) and an etch stop layer 36 of tantalum nitride (TaN) are deposited overlying the dielectric layer 30 by an ALD process or the like. In an exemplary embodiment, using the etch stop layer 36, first and/or second work function layers 38 and 40 are formed overlying the etch stop layer 36 using a deposition process, such as a physical vapor deposition (PVD) process, CVD process, an ALD process, or the like, and an etching process (e.g., dry etching process). Depending upon the desired function of the device, the metal gate stack 26 may include one or both of the first and second work function layers 38 and 40. In one example, the first and/or second work function layers 38 and 40 correspondingly have a thickness of from about 0.5 to about 10 nm. In an exemplary embodiment, if the first or second work function layer 38 or 40 is a P-type work function metal, the layer 38 or 40 includes TiN, or if the first or second work function layer 38 or 40 is a N-type work function metal, the layer 38 or 40 includes TiAl, TiAlC, TiC, TaC, TaAl, TaAlC, TaAlN, or TiAlCN.

A wetting layer 42 is deposited overlying the first and/or second function layers 38 and 40, for example, by a PVD process or the like. The wetting layer 42 helps promote adhesion between aluminum and the adjacent work function layer 38 or 40. In an exemplary embodiment, the wetting layer 42 is Ti, such as for an Al metal gate or TiN or WN for a W metal gate, and has a thickness of from about 0.5 to about 6 nm. Overlying the wetting layer 42, an aluminum or tungsten fill 43 is deposited in a remaining portion 44 of the FET trench 24 using, for example, a CVD process or the like. In an exemplary embodiment, the aluminum or tungsten fill 43 has a thickness of from about 20 to about 300 nm. Next, an upper surface 46 of the FET region 16 is planarized by a chemical mechanical planarization (CMP) process.

Figure 2:
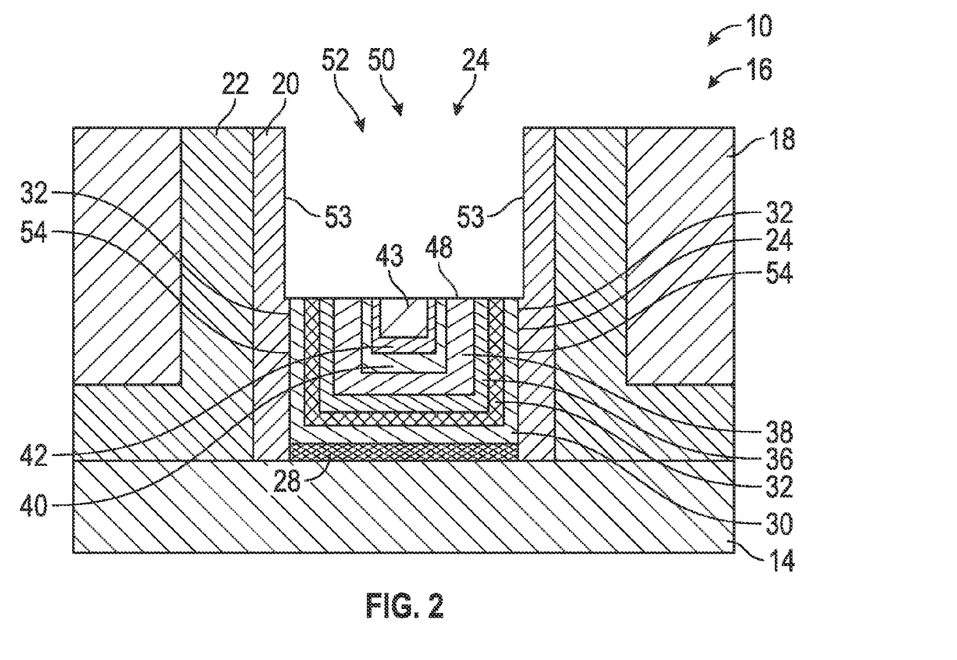
Figure 3:
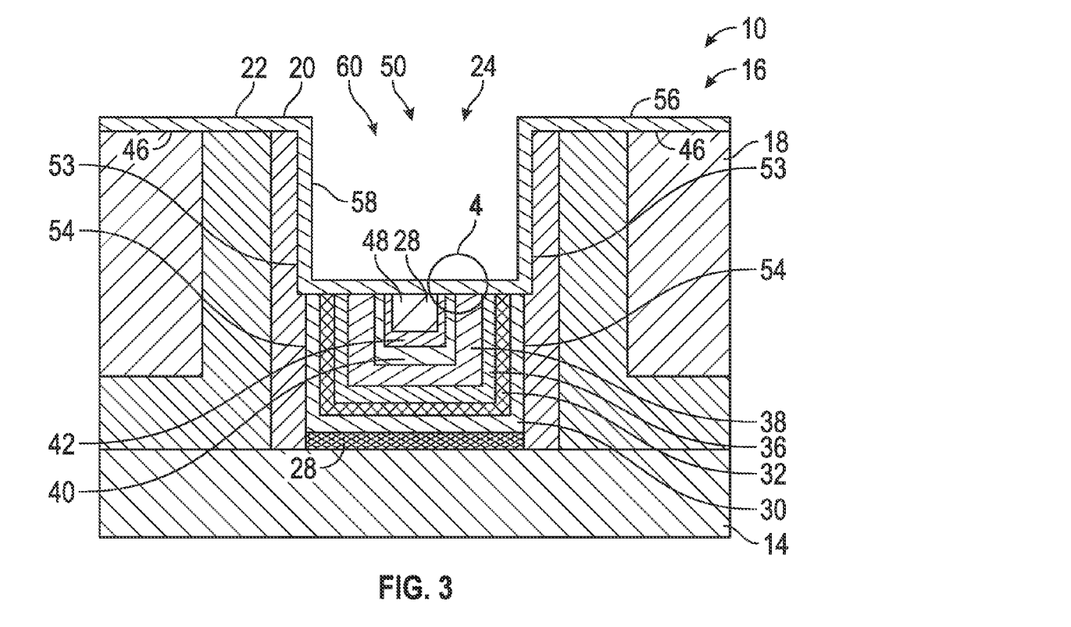

FIGS. 2-3 illustrate, in cross sectional views, a portion of the IC 10 at further advanced fabrication stages in accordance with an exemplary embodiment. The metal gate stack 26 is recessed by removing an upper portion of the metal gate stack 26 via a dry, wet or combined etching process to form a recessed metal gate stack 48 and a recess 50 that is disposed along an upper section 52 of the FET trench 24 above the recessed metal gate stack 48. A typical process is to use RIE (reactive ion etching) to recess the metal gate, followed by a wet clean to remove residues. As illustrated, an upper portion 53 of the wall linings 32 of the spacer 20 is slightly etched back laterally during the etching process such that the recess 50 is slightly wider than a lower portion 54 of the FET trench 24. A liner-forming material(s) 56 is deposited overlying the upper surface 46 of the FET region 16, the upper portion 53 of the spacer 20, and the recessed metal gate stack 48 to define a liner 58 disposed in the recess 50. As illustrated, the liner 58 is formed directly on the upper portion 53 and the recessed metal gate stack 48 and defines an inner cavity 60 in the recess 50.

Figure 4A:
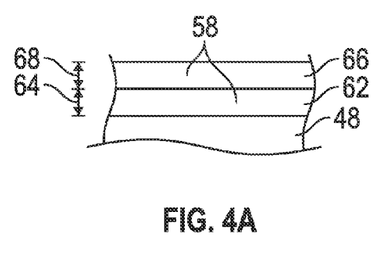
Figure 4B:
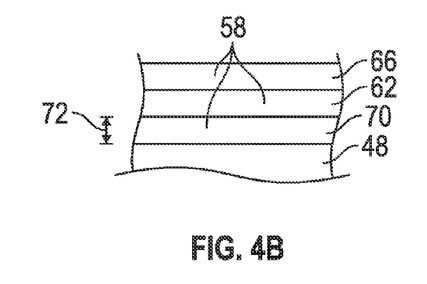

FIGS. 4A and 4B are enlarged views of the liner 58 depicted in FIG. 3 along an area indicated by single headed arrow 4 in accordance with various exemplary embodiments. Referring to FIGS. 3 and 4A, in an exemplary embodiment, the liner 58 includes at least a barrier layer 62 that substantially prevents migration of copper through the liner 58. In one example, the barrier layer 62 is formed of TiN. In another example, the barrier layer 62 is formed of TaN. The barrier layer 62 may be formed by depositing TiN or TaN overlying the upper portion 53 and the recessed metal gate stack 48 using a CVD process or an ALD process. In an exemplary embodiment, the barrier layer 62 has a thickness (indicated by double headed arrow 64) of from about 1 to about 10 nm, such as about 2 to about 4 nm, for example about 3 nm.

In an exemplary embodiment, a nucleation layer 66 is deposited onto the barrier layer 62 overlying the upper portion 53 and the recessed metal gate stack 48. The nucleation layer 66 helps facilitate bonding between copper and the liner 58. In an exemplary embodiment, the nucleation layer 66 is formed of tungsten (W) and/or ruthenium (Ru). In one example, the nucleation layer 66 is formed by depositing W and/or Ru onto the barrier layer 62 using a CVD process or an ALD process. In an exemplary embodiment, the nucleation layer 66 has a thickness (indicated by double headed arrow 68) of from about 1 to about 10 nm, such as from about 1 to about 3 nm, for example about 2 nm.

Referring to FIGS. 3 and 4B, in an exemplary embodiment, the liner 58 may also include a conductive layer 70 in addition to the barrier and nucleation layers 62 and 66. The conductive layer 70 is for lowering resistance between a copper conductive fill 71 (see FIGS. 5E, 6F, and 7E) and the recessed metal gate stack 48. In an exemplary embodiment, the conductive layer 70 is formed by depositing substantially pure Ti overlying and directly onto the upper portion 53 and the recessed metal gate stack 48 prior to depositing the barrier layer 62. As used herein, the term "substantially pure Ti" means Ti having no more than about 2% impurities. In one example, the conductive layer 70 is formed by depositing the substantially pure Ti using a PVD process. In an exemplary embodiment, the conductive layer 70 has a thickness (indicated by double headed arrow 72) of from about 1 to about 10 nm, such as from about 4 to about 6 nm, for example about 5 nm.

Figure 5A:
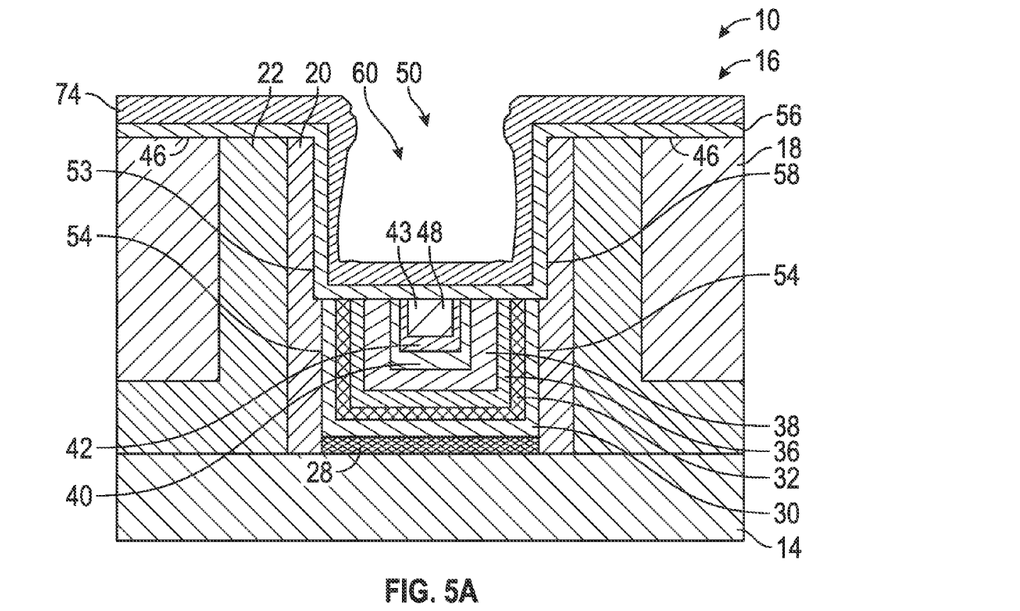

FIGS. 5A-5E illustrate, in cross sectional views, a portion of the IC 10 at further advanced fabrication stages in accordance with an exemplary embodiment. The process continues as illustrated in FIG. 5A by depositing a copper seed layer 74 over the liner-forming material 56. As such, the copper seed layer 74 is disposed over the liner 58 inside of the inner cavity 60 and over the liner-forming material 56 that overlies the upper surface 46 of the FET region 16. In one example, the copper seed layer 74 is deposited using a PVD or CVD process. In an exemplary embodiment, the copper seed layer 74 has an overall thickness of from about 1 to about 10 nm. Notably, as illustrated in FIG. 5A, although the copper seed layer 74 is a relatively thin layer, the deposition of copper substantially narrows the recess 50 laterally adjacent to the upper surface 46 due to the buildup of material such that subsequent filling of the inner cavity 60 with copper without forming voids using conventional processes would be challenging.

Figure 5B:
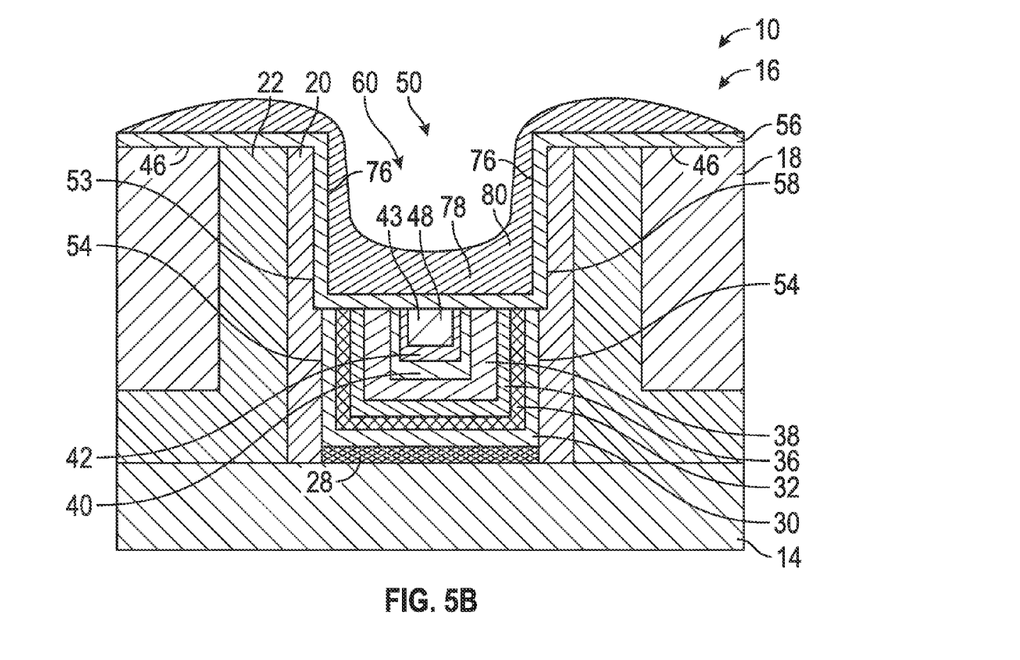

Referring also to FIG. 5B, the copper seed layer 74 is reflowed to redistribute some of the copper disposed over the liner-forming material 56 above the upper surface 46 and on an upper portion 76 of the liner 58 to a bottom portion 78 of the inner cavity 60 to form a reflowed copper seed layer 80. As illustrated, the reflowed copper seed layer 80 partially fills the inner cavity 60. In an exemplary embodiment, the reflowed copper seed layer 80 is formed by exposing the copper seed layer 74 to a temperature of from about 200 to about 300° C. for a time of from about 30 seconds to about 15 minutes.

Figure 5C:
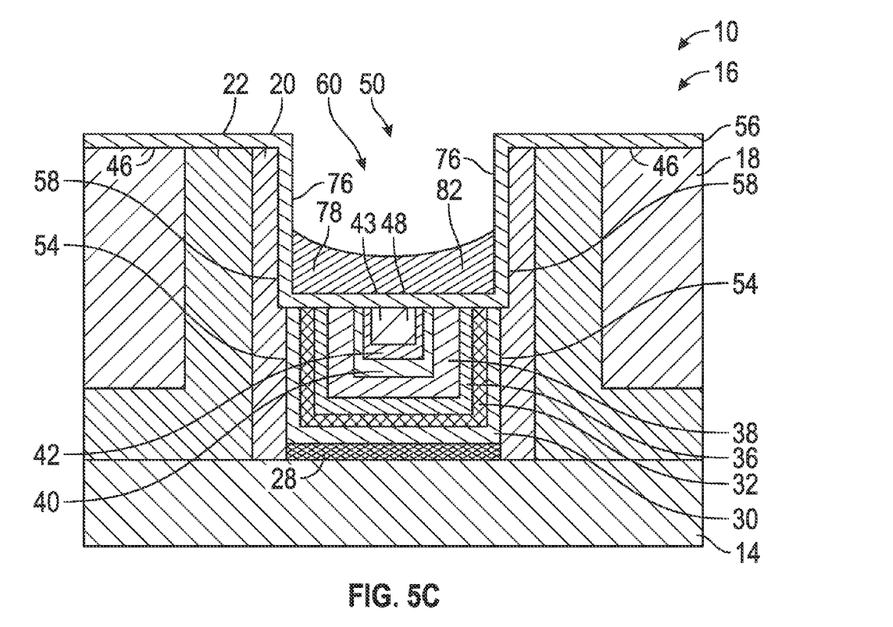

The process continues by etching the reflowed copper seed layer 80 as illustrated in FIG. 5C using an etching process. Wet etch is preferred because copper is easier to remove by a chemical process. One example of a wet etch is to use $NH_4OH:H_2O_2:H_2O$ at about a 1:1.5:26 ratio at about 25 to about 60° C. for about 1 to about 10 minutes. Another example is to use very dilute HCl at about room temperature. A third example is to use about 1% citric acid at about 60° C. after the copper is oxidized by a chemistry containing an oxidizer such as peroxide. In an exemplary embodiment, after etching, the upper portion 76 of the liner 58 is exposed and substantially free of copper while a portion 82 of copper remains in the bottom portion 78 of the inner cavity 60. After recess, the bottom portion 78 may have about 2 to about 20 nm of Cu remaining (defining a thickness of the portion 82) in the bottom portion 78.

Figure 5D:
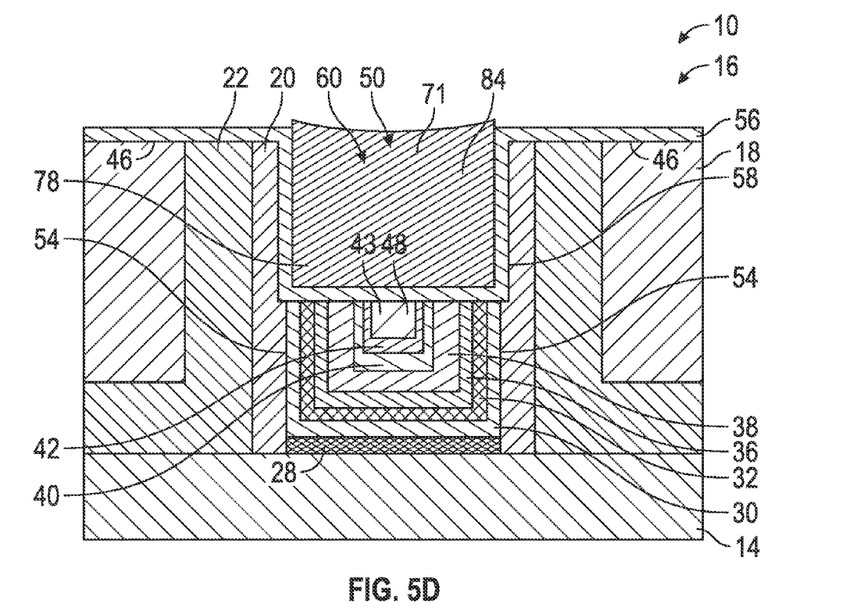

Referring also to FIG. 5D, in an exemplary embodiment, copper is then electrolessly deposited by exposing the FET region 16 to an electroless deposition solution, which deposits and grows copper only in areas of the FET region 16 where copper is already present. As illustrated, copper is deposited on and grows upward from the portion 82 of copper disposed in the bottom portion 78 (see FIG. 5C) to fill a remaining portion 84 of the inner cavity 60 to form the copper conductive fill 71. Because copper is present only in the bottom portion 78 of the inner cavity 60 when the FET region 16 is exposed to the electroless deposition solution, copper grows substantially in a single direction from the bottom portion 78 of the inner cavity 60 upward to fill the inner cavity 60 so that the copper conductive fill 71 is substantially void-free.

Electroless deposition solutions for copper are well known and typically include, for example, a source of copper ions, a reducing agent, and a complexing agent and/or a chelating agent. In an exemplary embodiment, the electroless deposition process occurs with the electroless deposition solution at a temperature of from about 20 to about 100° C. and for a time sufficient to permit copper to backfill the inner cavity 60 of the recess 50.

Figure 5E:
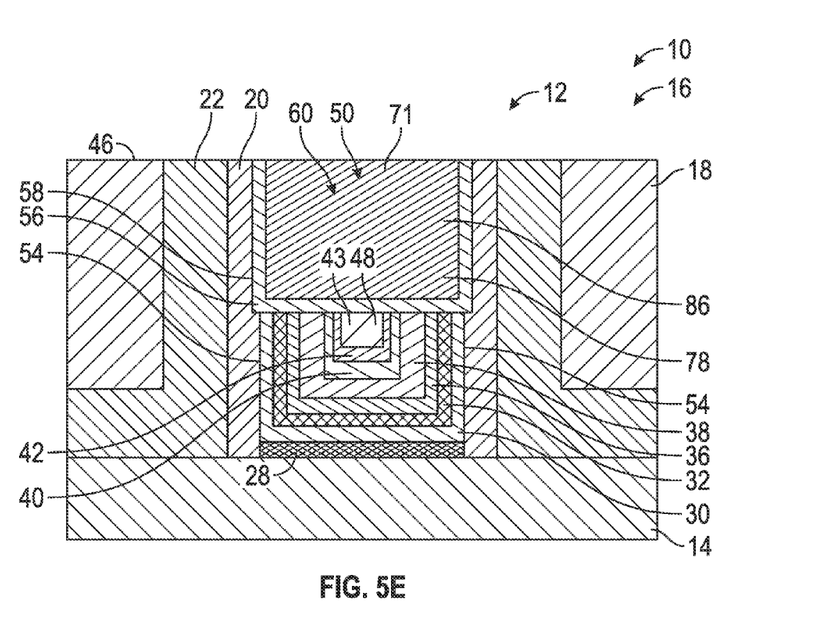

In an exemplary embodiment, the process continues as illustrated in FIG. 5E by annealing the copper conductive fill 71 to form annealed copper 86. In one example, the copper conductive fill 71 is annealed by exposing the copper conductive fill 71 to a temperature of from about 100 to about 400° C. for a time of from about 15 minutes to about 2 hours. Next, the liner-forming material 56 that overlies the upper surface 46, an upper-most portion the liner 58, and any excess of the annealed copper 86 that is disposed adjacent to the uppermost portion of the liner 58 are removed using a CMP process to finish fabrication of the metal gate structure 12.

Figure 6A:
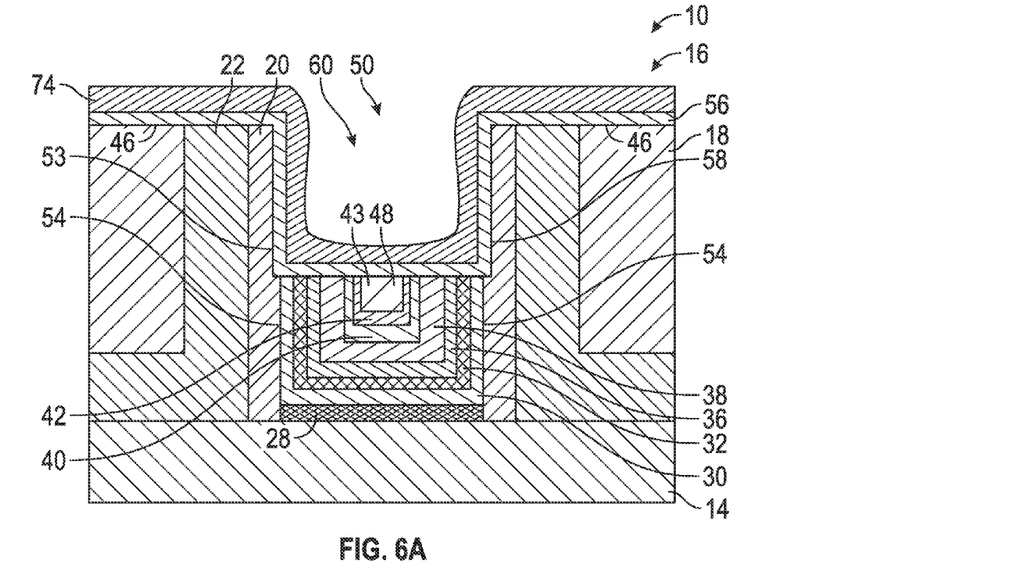

FIGS. 6A-6F illustrate, in cross sectional views, a portion of the IC 10 at further advanced fabrication stages after the fabrication stage illustrated in FIG. 3 in accordance with another exemplary embodiment. The process continues as illustrated in FIG. 6A by depositing a copper seed layer 74 over the liner-forming material(s) 56 as discussed above in relation to FIG. 5A. As such, the copper seed layer 74 is disposed over the liner 58 inside of the inner cavity 60 and over the liner-forming material 56 that overlies the upper surface 46 of the FET region 16.

Figure 6B:
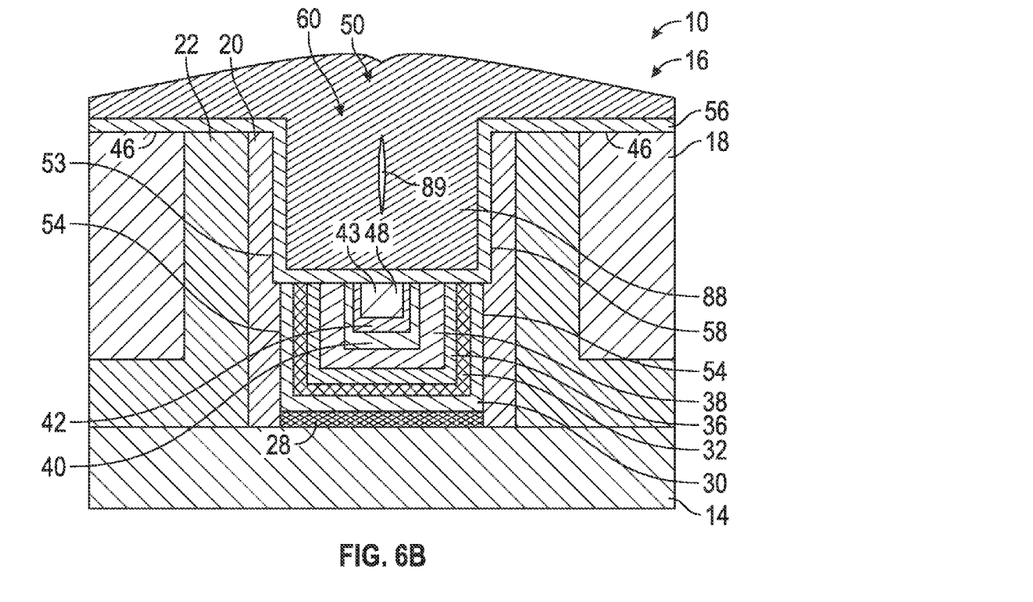

Referring also to FIG. 6B, the process continues by depositing a layer of copper on the copper seed layer 74 to form a copper fill 88 that fills the inner cavity 60. As illustrated, a space(s) or void(s) 89 may be formed in the copper fill 88 particularly if the recess 50 is relatively narrow and/or has a relatively high aspect ratio. In an exemplary embodiment, the layer of copper is deposited onto the copper seed layer 74 using an electroplating process or a PVD process.

Figure 6C:
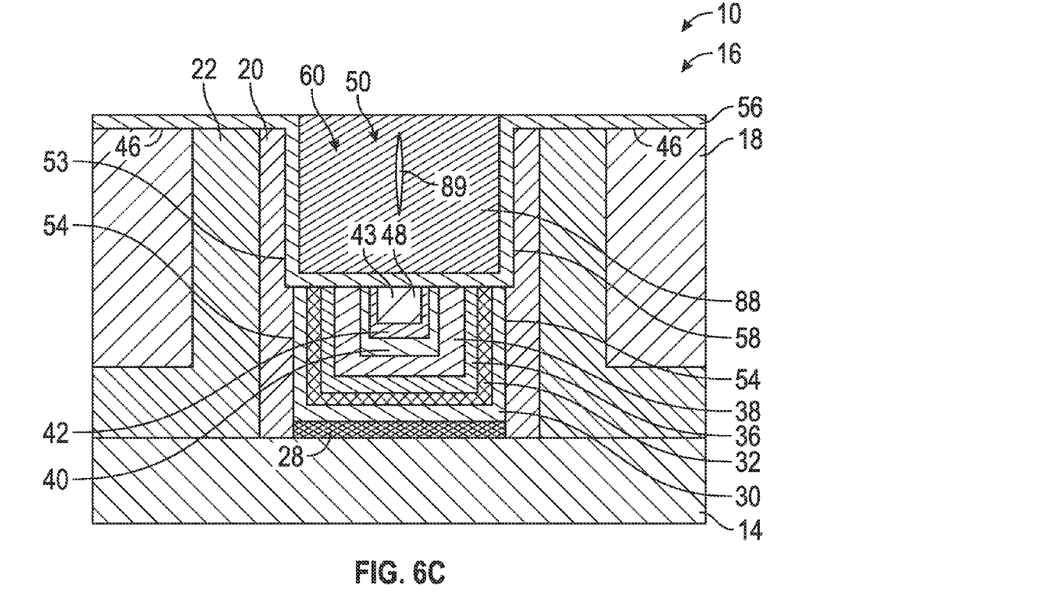
Figure 6D:
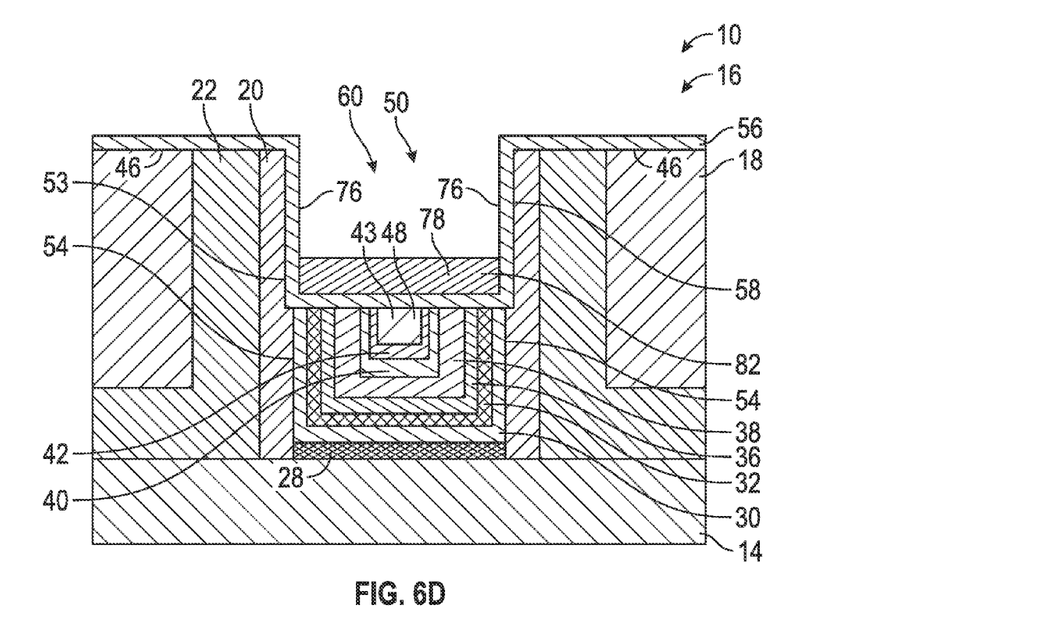

Referring to FIGS. 6C and 6D, copper disposed above the liner-forming material 56 that overlies the upper surface 46 is removed via a CMP process, and the copper fill 88 is etched using a well-known dry or wet etching process. In an exemplary embodiment, after etching, the upper portion 76 of the liner 58 is exposed and substantially free of copper while the portion 82 of copper remains in the bottom portion 78 of the inner cavity 60. As illustrated, the void(s) 89 present in the copper fill 88 is removed after etching so that the portion 82 of copper in the bottom portion 78 of the inner cavity 60 is substantially solid.

Figure 6E:
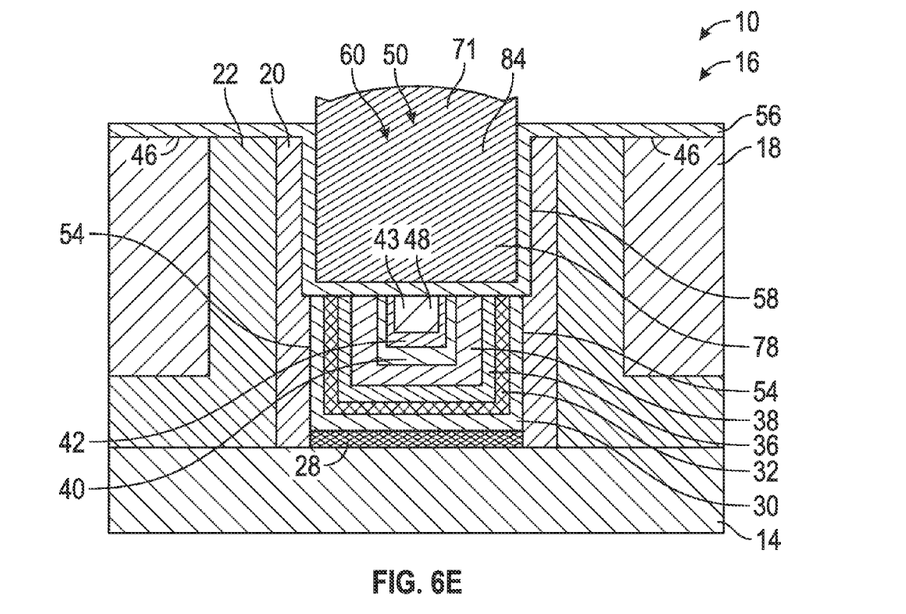

Referring to FIGS. 6D and 6E, in an exemplary embodiment and as discussed in relation to FIGS. 5C and 5D, copper is then electrolessly deposited by exposing the FET region 16 to an electroless deposition solution, which deposits and grows copper only in areas of the FET region 16 where copper is already present. As illustrated, copper is deposited on and grows upward from the portion 82 of copper disposed in the bottom portion 78 (see FIG. 6D) to fill the remaining portion 84 of the inner cavity 60 to form the copper conductive fill 71 that is substantially void-free.

Figure 6F:
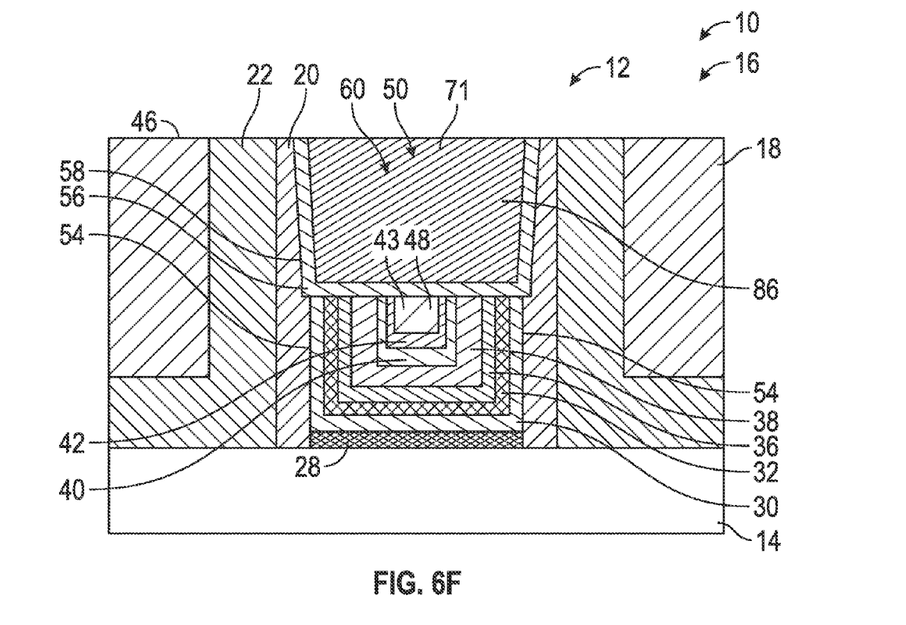

In an exemplary embodiment, the process continues as illustrated in FIG. 6F and as discussed above in relation to FIG. 5E by annealing the copper conductive fill 71 to form the annealed copper 86. Next, the liner-forming material 56 that overlies the upper surface 46 of the FET region 16, the uppermost portion the liner 58, and any excess of the annealed copper 86 that is disposed adjacent to the upper-most portion of the liner 58 are removed using a CMP process to finish fabrication of the metal gate structure 12.

Figure 7A:
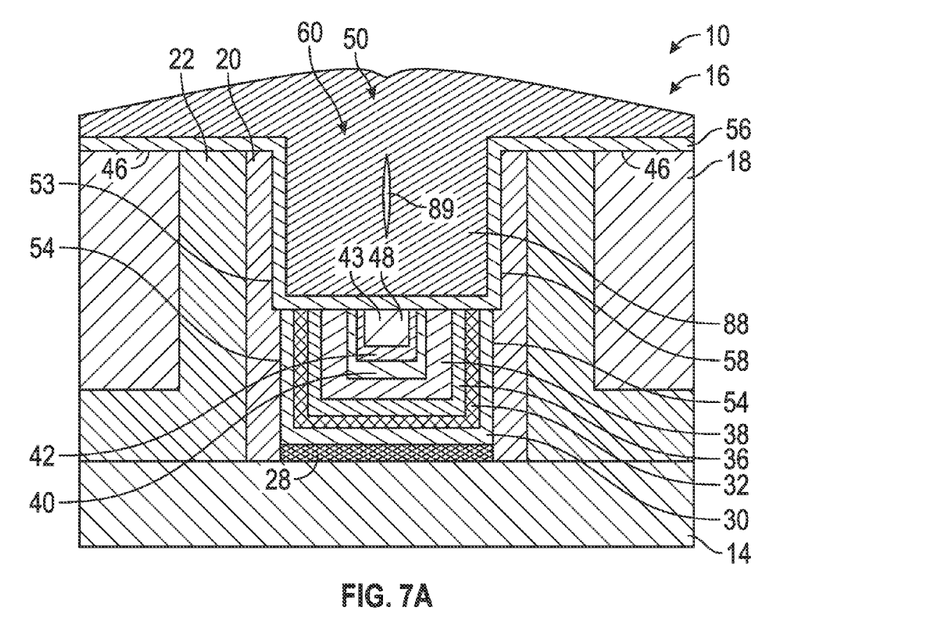

FIGS. 7A-7F illustrate, in cross sectional views, a portion of the IC 10 at further advanced fabrication stages after the fabrication stage illustrated in FIG. 3 in accordance with another exemplary embodiment. The process continues similarly to the exemplary embodiment illustrated in FIGS. 6A-6F except without the deposition of the copper seed layer 74 illustrated in FIG. 6A. Rather, and as illustrated in FIG. 7A, a layer of copper is deposited directly on the liner-forming material 56 including the liner 58 to form the copper fill 88 that fills the inner cavity 60. As illustrated, a space(s) or void(s) 89 may be formed in the copper fill 88 particularly if the recess 50 is relatively narrow and/or has a relatively high aspect ratio.

Figure 7B:
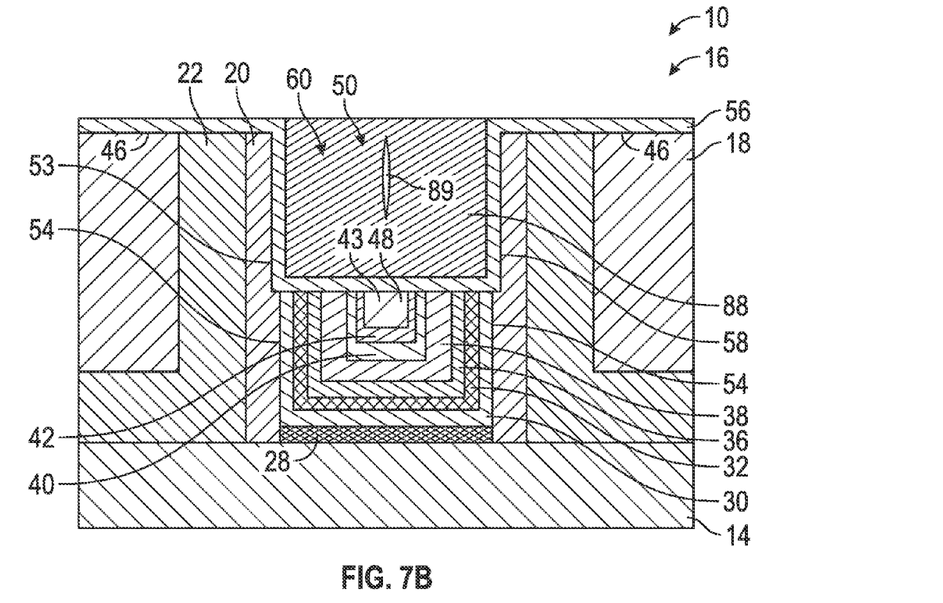
Figure 7C:
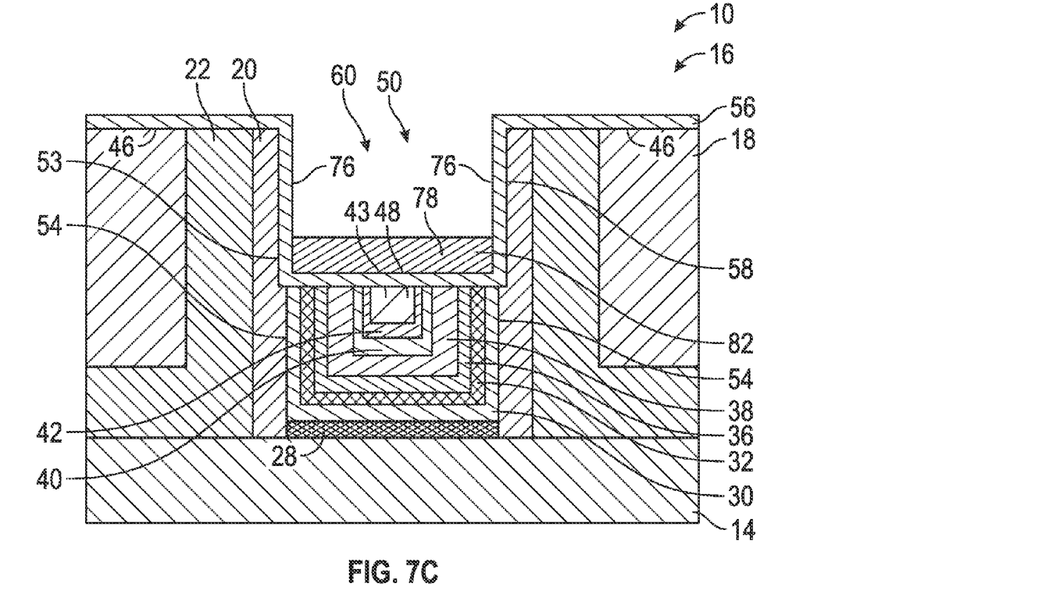

Referring to FIGS. 7B and 7C, copper disposed above the liner-forming material 56 that overlies the upper surface 46 of the FET region 16 is removed via a CMP process, and the copper fill 88 is etched using a well-known dry or wet etching process. In an exemplary embodiment, after etching, the upper portion 76 of the liner 58 is exposed and substantially free of copper while a portion 82 of copper remains in the bottom portion 78 of the inner cavity 60. As illustrated, the void(s) 89 present in the copper fill 88 is removed after etching so that the portion 82 of copper in the bottom portion 78 of the inner cavity 60 is substantially solid.

Figure 7D:
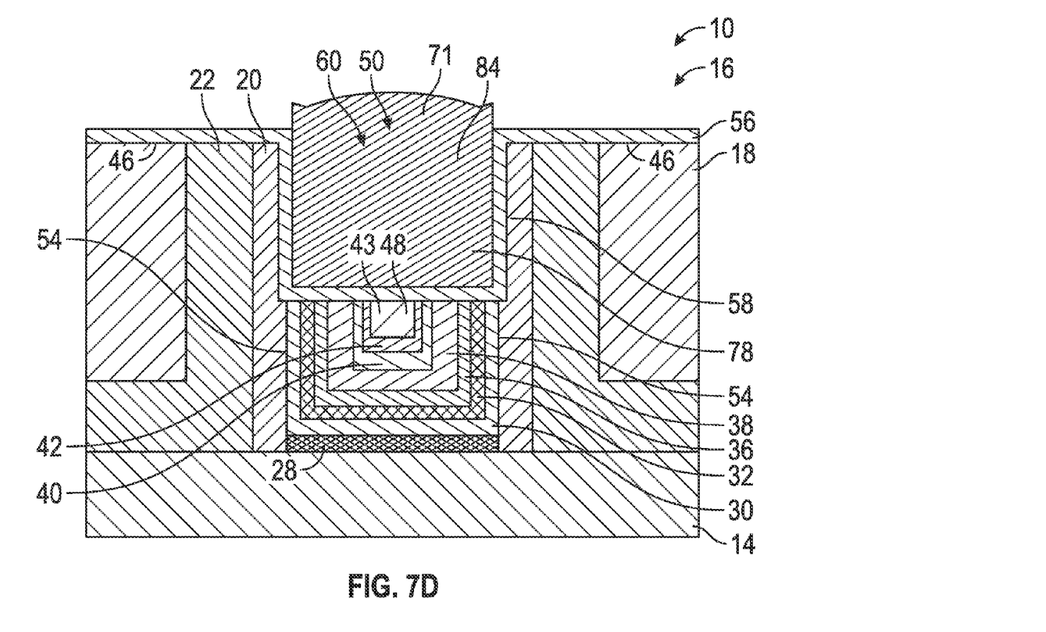

Referring to FIGS. 7C and 7D, in an exemplary embodiment and as discussed above, copper is then electrolessly deposited by exposing the FET region 16 to an electroless deposition solution, which deposits and grows copper only in areas of the FET region 16 where copper is already present. As illustrated, copper is deposited on and grows upward from the portion 82 of copper disposed in the bottom portion 78 (see FIG. 7C) to fill the remaining portion 84 of the inner cavity 60 to form the copper conductive fill 71 that is substantially void-free.

Figure 7E:
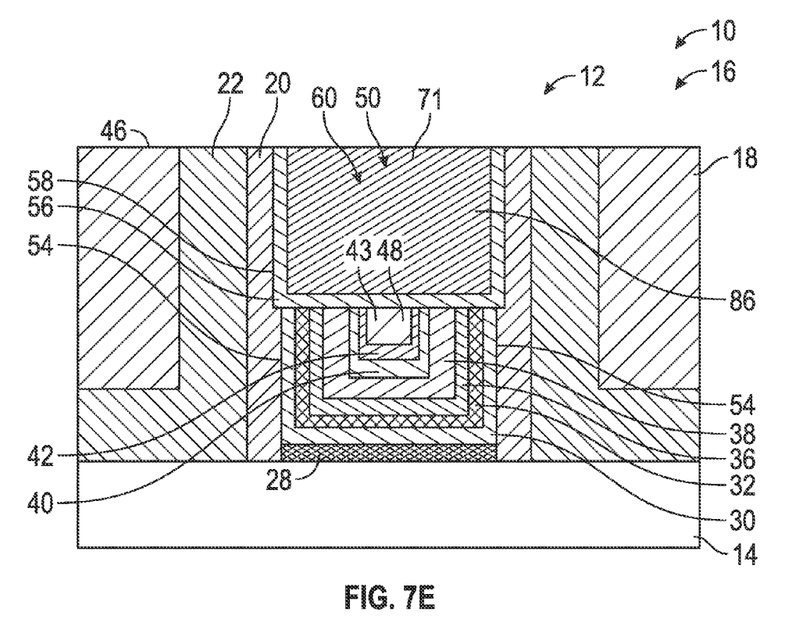

In an exemplary embodiment, the process continues as illustrated in FIG. 7E and discussed above by annealing the copper conductive fill 71 to form the annealed copper 86. Next, the liner-forming material 56 that overlies the upper surface 46 of the FET region 16, the upper-most portion the liner 58, and any excess of the annealed copper 86 that is disposed adjacent to the upper-most portion of the liner 58 are removed using a CMP process to finish fabrication of the metal gate structure 12.

Accordingly, methods for fabricating integrated circuits having low resistance metal gate structures have been described. During intermediate stages of the fabrication of an IC, a metal gate stack is formed in a FET trench that is formed in a FET region. The metal gate stack is etched to form a recessed metal gate stack and a recess. The recess is defined by sidewalls in the FET region and is disposed along an upper section of the FET trench above the recessed metal gate stack. A liner is formed overlying the sidewalls and the recessed metal gate stack and defines an inner cavity in the recess. A copper layer is formed overlying the liner and at least partially fills the inner cavity. The copper layer is etched to remove copper from an upper portion of the liner, thereby exposing the upper portion of the liner, while leaving some copper disposed in a bottom portion of the inner cavity. Copper is then electrolessly deposited on the copper in the bottom portion to fill a remaining portion of the inner cavity with copper and to form a substantially void-free copper fill that cooperatively functions with the recessed metal gate stack as a relatively low resistance metal gate structure.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an integrated circuit, the method comprising:
   forming a metal gate stack in a FET trench formed in a FET region that comprises an interlayer dielectric material on a semiconductor substrate;

etching the metal gate stack to form a recessed metal gate stack and a recess that is defined by sidewalls in the FET region and that is disposed along an upper section of the FET trench above the recessed metal gate stack;

forming a liner overlying the sidewalls and the recessed metal gate stack and defining an inner cavity in the recess;

forming a copper layer that overlies the liner and at least partially fills the inner cavity;

etching the copper layer to expose an upper portion of the liner while leaving a copper portion disposed in a bottom portion of the inner cavity; and electrolessly depositing copper on the copper portion to fill a remaining portion of the inner cavity.

2. The method of claim 1, wherein forming the liner comprises depositing a barrier layer overlying the sidewalls and the recessed metal gate stack, and wherein the barrier layer comprises TiN and/or TaN.

3. The method of claim 2, wherein depositing the barrier layer comprises forming the barrier layer using a chemical vapor deposition process or an atomic layer deposition process.

4. The method of claim 2, wherein forming the liner comprises depositing substantially pure Ti overlying the sidewalls and the recessed metal gate stack to form a conductive layer, and wherein depositing the barrier layer comprises depositing the barrier layer overlying the conductive layer.

5. The method of claim 4, wherein depositing the substantially pure Ti comprises forming the conductive layer using a physical vapor deposition process.

6. The method of claim 2, wherein forming the liner comprises depositing a nucleation layer overlying the barrier layer, and wherein the nucleation layer comprises W and/or Ru.

7. The method of claim 6, wherein depositing the nucleation layer comprises forming the nucleation layer using a chemical vapor deposition process or an atomic layer deposition process.

8. The method of claim 1, wherein etching the copper layer comprises etching the copper layer using a wet and/or dry etching process.

9. The method of claim 1, wherein etching the copper layer comprises forming the copper portion having a thickness of from about 2 to about 20 nm.

10. The method of claim 1, further comprising:
annealing copper disposed in the inner cavity to form annealed copper after electrolessly depositing copper.

11. The method of claim 10, wherein annealing copper comprises exposing copper disposed in the inner cavity to a temperature of from about 100 to about 400° C.

12. The method of claim 11, wherein annealing copper comprises exposing copper disposed in the inner cavity to the temperature for a time of from about 30 minutes to about 2 hours.

13. The method of claim 12, further comprising:
removing an upper-most portion of the liner and an excess portion of the annealed copper disposed adjacent to the upper-most portion of the liner using a chemical mechanical planarization process.

14. A method for fabricating an integrated circuit, the method comprising:
forming a metal gate stack in a FET trench formed in a FET region that comprises an interlayer dielectric material on a semiconductor substrate;

etching the metal gate stack to form a recessed metal gate stack and a recess that is defined by sidewalls in the FET region and that is disposed along an upper section of the FET trench above the recessed metal gate stack;

forming a liner overlying the sidewalls and the recessed metal gate stack and defining an inner cavity in the recess;

depositing a copper seed layer overlying the liner;

reflowing the copper seed layer to form a reflowed copper seed layer that partially fills the inner cavity;

etching the reflowed copper seed layer to expose an upper portion of the liner while leaving a copper portion disposed in a bottom portion of the inner cavity; and electrolessly depositing copper on the copper portion to fill a remaining portion of the inner cavity.

15. The method of claim 14, wherein reflowing the copper seed layer comprises exposing the copper seed layer to a temperature of from about 200 to about 300° C.

16. The method of claim 15, wherein reflowing the copper seed layer comprises exposing the copper seed layer to the temperature for a time of from about 30 seconds to about 15 minutes.

17. A method for fabricating an integrated circuit, the method comprising:
forming a metal gate stack in a FET trench formed in a FET region that comprises an interlayer dielectric material on a semiconductor substrate;

etching the metal gate stack to form a recessed metal gate stack and a recess that is defined by sidewalls in the FET region and that is disposed along an upper section of the FET trench above the recessed metal gate stack;

forming a liner overlying the sidewalls and the recessed metal gate stack and defining an inner cavity in the recess;

filling the inner cavity with copper to define a copper fill;

etching the copper fill to expose an upper portion of the liner while leaving a copper portion disposed in a bottom portion of the inner cavity; and electrolessly depositing copper on the copper portion to fill a remaining portion of the inner cavity.

18. The method of claim 17, wherein filling the inner cavity comprises:
depositing a copper seed layer overlying the liner;
reflowing the copper seed layer to form a reflowed copper seed layer that partially fills the inner cavity; and
depositing copper on the reflowed copper seed layer to form the copper fill.

19. The method of claim 17, wherein filling the inner cavity comprises:
depositing copper directly on the liner to form the copper fill.

20. The method of claim 17, wherein filling the inner cavity comprises:
depositing copper overlying the liner using an electroplating process or a physical vapor deposition process.

* * * * *